United States Patent [19]

Gardner

[11] 4,246,076

[45] Jan. 20, 1981

[54] METHOD FOR PRODUCING NOZZLES FOR INK JET PRINTERS

[75] Inventor: William R. Gardner, Wilton, Conn.

[73] Assignee: Xerox Corporation, Stamford, Conn.

[21] Appl. No.: 101,044

[22] Filed: Dec. 6, 1979

[51] Int. Cl.³ .............................................. C25D 1/08
[52] U.S. Cl. ..................................................... 204/11
[58] Field of Search ................................. 209/11, 24

[56] References Cited

U.S. PATENT DOCUMENTS

| | | | |
|---|---|---|---|
| 3,449,221 | 6/1969 | Thomas | 204/11 |
| 3,461,045 | 8/1969 | Franks | 204/11 |
| 4,080,267 | 3/1978 | Castellani | 204/11 |
| 4,112,436 | 9/1978 | Cone | 346/140 R |
| 4,157,935 | 6/1979 | Solyst | 156/644 |
| 4,184,925 | 1/1980 | Kenworthy | 204/11 |

*Primary Examiner*—T. M. Tufariello

[57] ABSTRACT

A divergent ink jet nozzle array is made by forming by photochemical means suitably shaped polymeric posts on a conductive substrate, then electroplating a metallic material around the posts. The metallic material is stripped from the substrate, and the posts dissolved providing a well-defined ink jet array.

2 Claims, 7 Drawing Figures

METHOD FOR PRODUCING NOZZLES FOR INK JET PRINTERS

This invention relates to a method for forming divergent nozzles having an enlarged meniscus-forming section, and, more particularly, the invention relates to the fabrication of such nozzles for ink jet printers.

A sufficient pressure pulse addressed to a surface tension constrained liquid in a capillary orifice will cause a minute drop of the liquid to be expressed from that orifice. If the liquid is replenished from a reservoir, the procedure can be repeated at a rate dependent only on the time required for replenishment. Devices based on the above phenomenon are referred to as pressure pulse drop ejectors.

Pressure pulse drop ejectors are used as drop-on-demand ink jet marking devices. Other terms for these devices in the literature include impulse jets, asynchronous jets and negative pressure jets. Advantages of using pressure pulse drop ejectors as marking devices are their mechanical simplicity, quiet operation and ability to put visible ink marks onto plain paper in accordance with a programmed input bit stream.

A improved nozzle for such systems has recently been described. These nozzles have a throat section and an enlarged meniscus-forming section. The meniscus-forming section is about 1.5 to about 5 times the diameter of the throat sections. Preferred nozzles have throat diameters between 20 and 80 micrometers, meniscus-forming diameters of from about 12 to about 25 micrometers larger than the throat diameter and a depth of the meniscus-forming area of from about 25 micrometers to about 50 micrometers.

The present invention is directed to a preferred method for making such nozzles. The advantage of the present invention is that it provides a relatively inexpensive method for accurately fabricating such nozzles. One of the primary requirements to enable the fabrication of low-cost ink jet printer arrays is a process for the inexpensive manufacture of high-quality nozzles. In addition to economy, a nozzle fabrication process must also satisfy several other requirements, including accurate and repeatable reproduction of small, typically 20 to 80 micrometer diameter holes, accurate control of internal nozzle profile, e.g., whether cylindrical or otherwise shaped, an inner surface sufficiently smooth so as not to disrupt the desired flow of ink, and sharply defined, disturbance-free terminations.

Two techniques known in the prior art are deficient for one or more reasons. Excellent nozzles can be made by drilling; however, the specialized equipment and high labor requirements make it cost prohibitive for large arrays. Nozzles can be made inexpensively by assembly of molded plastic components, but satisfactory control of the exit geometry is difficult. Additionally, the fabrication of molds for this type of part is a lengthy, tedious and expensive process. The present invention is intended to provide a remedy for the above problems.

The preferred method is described in detail below with reference to the drawing, in which.

Figure 1A:
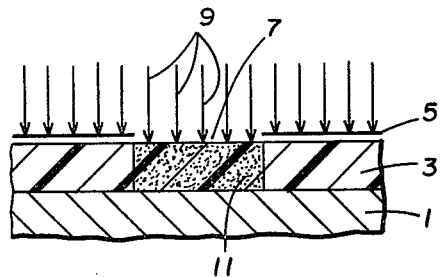
FIGS. 1a-1e represent sequential cross-section views of an ink jet forming process showing one nozzle in accordance with this invention.
Figure 1B:
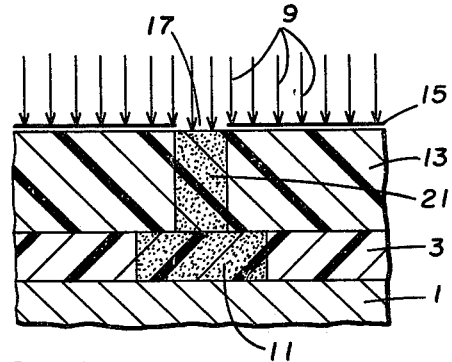
Figure 1C:
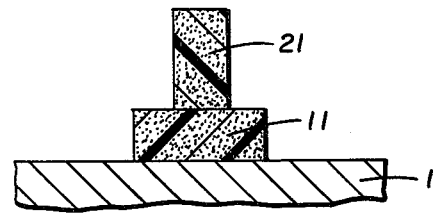

Referring now to FIG. 1a, there is seen a substrate 1, which is, e.g., a mandrel plate having an electrically conductive surface suitable for development thereon of adherent patterns of a photo-polymerizable material. The same surface should also be passivated to allow for the removal therefrom of an electrodeposited metallic layer. By "passivated" is meant that the material is treated, usually by oxidation, so as to decrease the adherence of subsequently plated layers. Typical materials suitable for use as a substrate surface would include nickel, stainless steel, aluminum, chromium or silver. Treatment may range from simple exposure to air to immersion in strong oxidizing agents. A suitable photoresist layer 3, such as Riston, a photo-polymerizable material available from E. I. Du Pont, is coated on substrate 1 to a thickness equal to the desired depth of the meniscus-forming area, typically 25 micrometers to about 50 micrometers. The photoresist layer 3 is exposed through a suitable mask 5 having openings therein of a size and shape desired for the meniscus-forming area. As an example, for a circular cross section, the diameter of opening 7 would be from about 30 to about 100 micrometers. The radiation 9 to which the photoresist layer 3 is exposed is of wavelength to which layer 3 is sensitive. Typically, the radiation 9 would be provided by a mercury or xenon light source depending, of course, on the sensitivity of the photoresist layer 3. These sources may be accompanied by suitable filters if necessary and a lens system to collimate the light if necessary. In this case, radiation 9 is preferably collimated because of the small dimensions involved. Radiation 9 causes a polymerized latent image represented by area 11 to be formed. Mask 5 is then removed, and a second layer 13 of a suitable photoresist is coated on layer 3 as seen in FIG. 1b. Layer 13 is coated to a depth considered, together with layer 3, greater than the thickness desired in the final array plate. Layer 13 is exposed through mask 15 containing openings 17 therein, openings 17 being of a size and shape desired for the nozzle throat. For example, where a circular cross-section nozzle throat is desired, a circular opening 17 of a diameter of from about 20 to about 80 micrometers is typical. The second exposure causes a second polymerized latent image represented by area 21 to be formed. Both photopolymer layers 3 and 13 are then developed chemically removing the non-polymerized areas of layers 3 and 13 leaving polymerized areas 11 and 21 adhering to each other and to substrate 1 leaving a post structure as shown in FIG. 1c.

Figure 1D:
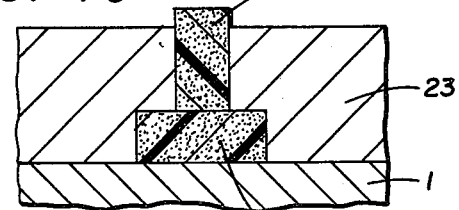
Figure 1E:
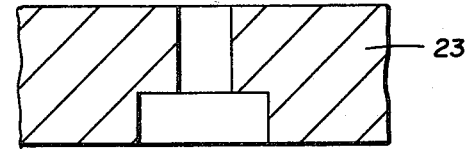

Referring now to FIG. 1d, layer 23 is electroplated onto substrate 1. Posts 11 and 21 prevent electroplating where they are present forming a substrate coated with electroplated layer 23 as shown in FIG. 1d. Typical layer 23 materials, which can be electrodeposited on substrate 1, include nickel, copper and various alloys. Layer 23 is then stripped from substrate 1 by any suitable mechanical or chemical means. Typically, some of posts 21 and 11 remain in layer 23. This polymeric material can be dissolved from the metallic layer 23 by using a suitable stripping solvent. Once materials 21 and 11 have been removed, a final nozzle array plate 23, as shown in FIG. 1e, is formed.

Figure 2:
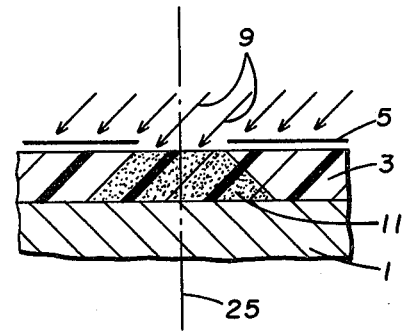
FIG. 2 shows a method for forming conical nozzles.

Other shapes as desired may be formed. For example, as shown in FIG. 2, a conical nozzle is formed. The columnar light beam 9 is rotatable about axis 25, which axis is conveniently perpendicular to layer 3. A conical area 11 is exposed as shown in FIG. 2, which would result after development, electroplating and stripping in a conical ink jet nozzle. Alternatively, the light source can be fixed, and substrate 1 can be rotated around axis 25 to provide a conical exposed area.

Figure 3:
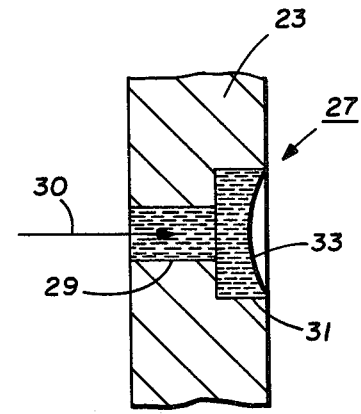
FIG. 3 shows how a divergent ink jet nozzle is used.

Referring now to FIG. 3, there is seen divergent nozzle generally designated as 27, which is made up of throat section 29 through which ink and pressure pulses are transmittted in the direction shown by arrow 30 to enlarged meniscus-forming area 31. At rest, ink meniscus 33 is formed as shown. The advantages of the use of such nozzles in ink jet systems are disclosed in U.S. patent application Ser. No. 910,802, filed May 30, 1978, in the U.S. Patent and Trademark Office, the disclosure of which is hereby incorporated by reference.

While the invention has been particularly shown and described with reference to preferred embodiments thereof, it will be understood by those skilled in the art that various changes in the form and details may be made therein without departing from the spirit and scope of the invention.

What is claimed is:

1. The method for producing nozzle arrays for ink jet printers comprising the steps of:
   (a) coating a first layer of a photopolymerizable material on a substrate,
   (b) exposing said first layer of a photopolymerizable material to a pattern of radiation to which said photopolymerized material is sensitive until at least a portion of said first layer of photopolymerizable material polymerizes,
   (c) coating the free surface of said first layer of a photopolymerizable material with a second layer of a photopolymerizable material,
   (d) exposing said second layer of a photopolymerizable material to a pattern of radiation to which said second layer of a photopolymerizable material is sensitive until at least a portion of said second layer of a photopolymerizable material polymerizes, such polymerized portions of the second layer being approximately coaxial with and smaller in size than the polymerized regions in the first layer,
   (e) developing both said layers of photopolymerizable material to remove non-polymerized material from said substrate,
   (f) electroplating a layer of a metallic material onto said substrate, and
   (g) stripping said layer of metallic material from said substrate.

2. The method of claim 1 wherein there is provided relative movement between said radiation and said photopolymerizable material.

* * * * *